United States Patent
Komuro et al.

(10) Patent No.: US 7,550,392 B2
(45) Date of Patent: Jun. 23, 2009

(54) SEMICONDUCTOR DEVICE AND METHOD OF MANUFACTURING THE SAME

(75) Inventors: Genichi Komuro, Kawasaki (JP); Kenji Kiuchi, Kawasaki (JP)

(73) Assignee: Fujitsu Microelectronics Limited, Tokyo (JP)

(*) Notice: Subject to any disclaimer, the term of this patent is extended or adjusted under 35 U.S.C. 154(b) by 380 days.

(21) Appl. No.: 11/224,029

(22) Filed: Sep. 13, 2005

(65) Prior Publication Data

US 2006/0281316 A1 Dec. 14, 2006

(30) Foreign Application Priority Data

Jun. 9, 2005 (JP) ............... 2005-169377

(51) Int. Cl.
*H01L 21/302* (2006.01)

(52) U.S. Cl. ............ 438/725; 438/3; 438/714; 438/717; 438/734; 438/736; 438/950; 430/5

(58) Field of Classification Search .......... 430/5; 438/3, 714, 717, 725, 734, 736, 950
See application file for complete search history.

(56) References Cited

U.S. PATENT DOCUMENTS

| 6,225,156 B1* | 5/2001 | Cuchiaro et al. ............ 438/240 |
| 6,420,272 B1* | 7/2002 | Shen et al. ................ 438/702 |
| 6,713,310 B2* | 3/2004 | Song et al. .................. 438/3 |
| 6,737,692 B2* | 5/2004 | Gabric et al. .............. 257/295 |
| 6,841,819 B2 | 1/2005 | Saito et al. |
| 7,041,511 B2* | 5/2006 | Zhang et al. ................ 438/3 |
| 2003/0143853 A1* | 7/2003 | Celii et al. ................ 438/694 |

FOREIGN PATENT DOCUMENTS

| JP | 2003-258127 | 9/2003 |
| JP | 2003-273328 | 9/2003 |
| JP | 2003-318371 | 11/2003 |
| JP | 2004-47943 | 2/2004 |
| JP | 2004-241679 | 8/2004 |
| JP | 2004-247324 | 9/2004 |
| JP | 2004-253627 | 9/2004 |
| JP | 2004-311868 | 11/2004 |
| JP | 2005-123392 | * 5/2005 |

* cited by examiner

*Primary Examiner*—George A. Goudreau
(74) *Attorney, Agent, or Firm*—Westerman, Hattori, Daniels & Adrian, LLP.

(57) ABSTRACT

A semiconductor device manufacturing method, includes a step of forming a first alumina film (underlying insulating film) 37 on a semiconductor substrate 20, a step of forming a first conductive film 41, a ferroelectric film 42, and a second conductive film 43 in sequence on the first alumina film 37, a step of forming a mask material film 45 on the second conductive film 43, a step of shaping the mask material film 45 into an auxiliary mask 45a, a step of shaping the second conductive film 43 into an upper electrode 43a by an etching using the auxiliary mask 45a and a first resist pattern 46 as a mask, a step of shaping the ferroelectric film 42 into a capacitor dielectric film 42a by patterning, and a step of shaping the first conductive film 41 into a lower electrode 41a by patterning, whereby a capacitor Q is constructed by the lower electrode 41, the capacitor dielectric film 42a, and the upper electrode 43a.

14 Claims, 11 Drawing Sheets

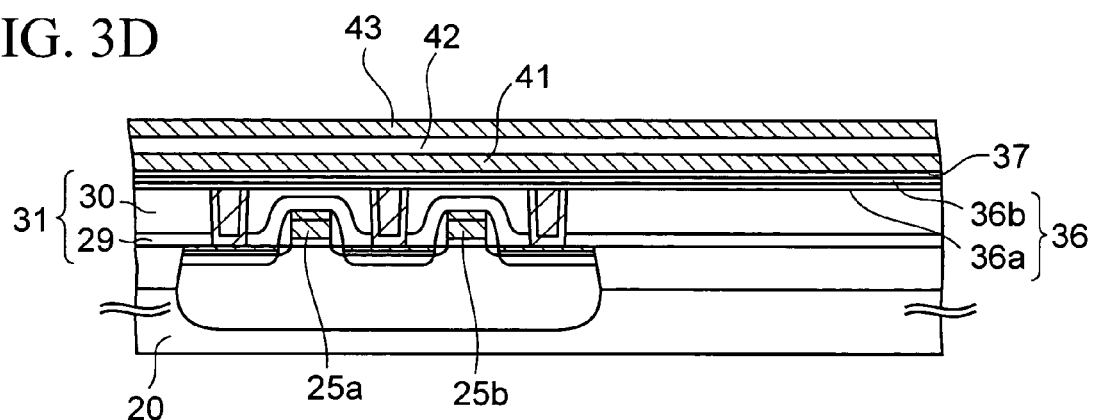
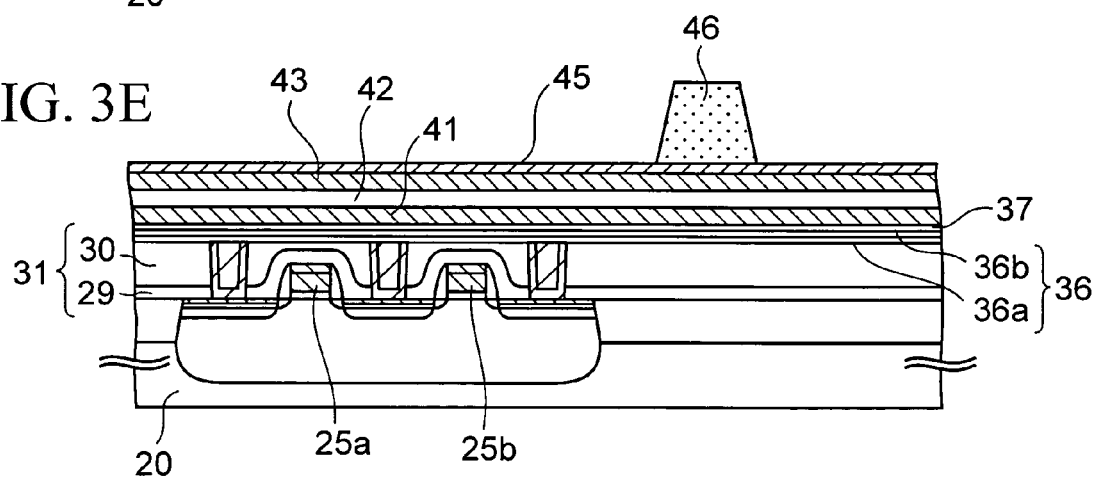
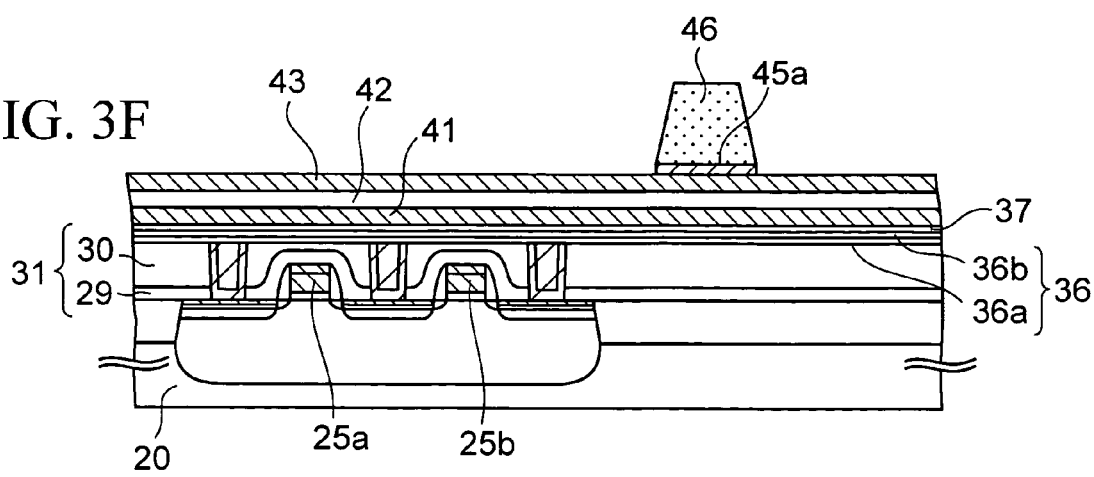

SEMICONDUCTOR DEVICE AND METHOD OF MANUFACTURING THE SAME

CROSS-REFERENCE TO RELATED APPLICATIONS

This application is based on and claims priority of Japanese Patent Application No. 2005-169377 filed on Jun. 9, 2005, the entire contents of which are incorporated herein by reference.

BACKGROUND OF THE INVENTION

1. Field of the Invention

The present invention relates to a semiconductor device and a method of manufacturing the same.

2. Description of the Related Art

As the nonvolatile memory capable of storing information even after the power supply is turned off, the flash memory and the ferroelectric memory are known.

Out of them, the flash memory has a floating gate buried in a gate insulating film of an insulated-gate field effect transistor (IGFET), and stores the information by accumulating electric charges representing the stored information in this floating gate. However, the flash memory has such a disadvantage that the memory needs a relatively high voltage because a tunnel current must be supplied to the gate insulating film in writing or erasing the information.

In contrast, the ferroelectric memory, also called FeRAM (Ferroelectric Random Access Memory), stores information by utilizing the hysteresis characteristic of the ferroelectric film formed in the ferroelectric capacitor. The ferroelectric film generates the polarization in response to the voltage applied between the upper electrode and the lower electrode of the capacitor. The spontaneous polarization still remains in the ferroelectric film after the voltage is taken away. When the polarity of the applied voltage is reversed, the spontaneous polarization is also reversed. Thus, the information can be written into the ferroelectric film by relating the direction of the spontaneous polarization with "1" and "0". The FeRAM has such advantages that the voltage required for the writing operation is lower than the flash memory and the writing operation can be performed at a higher speed than the flash memory.

The electric characteristics of the ferroelectric capacitor that the FeRAM has depend on unevenness of an upper surface of the upper electrode, in addition to a film quality of the ferroelectric film. Therefore, it is preferable to form the upper electrode so that the upper surface of the upper electrode is planarized.

In following Patent Literatures 1 to 8, technologies related to the above FeRAM are disclosed.

[Patent Literature 1] Patent Application Publication (KOKAI) 2004-311868

[Patent Literature 2] Patent Application Publication (KOKAI) 2003-273328

[Patent Literature 3] Patent Application Publication (KOKAI) 2003-258127

[Patent Literature 4] Patent Application Publication (KOKAI) 2003-318371

[Patent Literature 5] Patent Application Publication (KOKAI) 2004-247324

[Patent Literature 6] Patent Application Publication (KOKAI) 2004-241679

[Patent Literature 7] Patent Application Publication (KOKAI) 2004-253627

[Patent Literature 8] Patent Application Publication (KOKAI) 2004-47943

SUMMARY OF THE INVENTION

According to an aspect of the present invention, there is provided a semiconductor device manufacturing method, which includes a step of forming an underlying insulating film on a semiconductor substrate; a step of forming a first conductive film, a ferroelectric film, and a second conductive film in sequence on the underlying insulating film; a step of forming a mask material film on the second conductive film; a step of forming a resist pattern on the mask material film; a step of shaping the mask material film into an auxiliary mask, by etching the mask material film while using the resist pattern as a mask; a step of shaping the second conductive film into an upper electrode, by etching the second conductive film while using the auxiliary mask and the resist pattern as a mask; a step of removing the resist pattern; a step of removing the auxiliary mask; a step of shaping the ferroelectric film into a capacitor dielectric film by patterning; and a step of shaping the first conductive film into a lower electrode by patterning the first conductive film, whereby constructing a capacitor from the lower electrode, the capacitor dielectric film, and the upper electrode.

According to the present invention, when shaping the second conductive film into the upper electrode by the etching, the auxiliary mask that is hard to reduce in film thickness rather than the resist pattern is used as the etching mask. This auxiliary mask still remains on the upper electrode without a reduction in size after the above etching is ended. Therefore, since the upper surface of the upper electrode is not etched by the etching, a thin thickness portion having a thin thickness is not formed in the upper electrode.

In addition, contact between the resist pattern and the upper electrode is prevented by the auxiliary mask. Therefore, the upper surface of the upper electrode does not become rough even when the upper electrode is exposed to the oxygen-containing atmosphere such as the recovery annealing applied to the capacitor dielectric film.

Also, the step of etching the second conductive film is performed under etching conditions in which a side surface of the resist pattern goes back. Therefore, it can be suppressed that the re-adhered matter of the etching is formed like a fence on the side surface of the resist pattern.

It is preferable that a gas mixture consisting of a halogen gas and an inert gas is used as an etching gas in such an etching conditions.

Further, the step of etching the second conductive film may be performed by using an ICP (Inductively Coupled Plasma) etching equipment in which the quartz is employed as at least a part of a chamber. If doing so, a minute quantity of oxygen is supplied from the quartz, which is attacked by the plasma, into the etching atmosphere. Since the oxygen acts to oxidize a surface of the auxiliary mask and decelerate the etching rate of the auxiliary mask, it can be prevented that the thin auxiliary mask disappears owing to the above etching.

In the case where the gas mixture consisting of the halogen gas and the inert gas is used as the etching gas, such reduction in the etching rate of the auxiliary mask can be attained effectively when an occupation rate of the inert gas in the etching gas is set to 60% or more in terms of flow rate ratio.

In addition, if the auxiliary mask still remains on the upper electrode after the second conductive film is shaped into the upper electrode by the etching, the auxiliary mask is oxidized by the annealing such as the recovery annealing applied to the capacitor dielectric film in the oxygen atmosphere, and thus the auxiliary mask becomes the insulator. If such circumstance is occurred, it becomes difficult to apply a voltage to the upper electrode under the auxiliary mask.

Therefore, it is preferable that, after the second conductive film is etched, the auxiliary mask is removed by the etching. The etching of the auxiliary mask is carried out by the wet etching using the mixed solution consisting of hydrogen peroxide and ammonium hydroxide as the etchant, for example.

In addition, since the residues remain on the upper electrode after the auxiliary mask is removed in some cases, it is preferable that the residues are removed by exposing the upper electrode to the oxygen plasma.

Here, in order to make the removal of the auxiliary mask easy, it is preferable that a thickness of the auxiliary mask is set to as thin as possible, for example, to 50 nm or less.

Also, according to another aspect of the present invention, there is provided a semiconductor device, which includes a semiconductor substrate; an underlying insulating film formed on the semiconductor substrate; a lower electrode formed on the underlying insulating film and having a contact region; a capacitor dielectric film formed on the lower electrode in a region other than the contact region; an upper electrode formed on the capacitor dielectric film and having a planarized upper surface, the upper electrode constructing a capacitor in cooperation with the capacitor dielectric film and the lower electrode; an interlayer insulating film covering the capacitor and having a hole on the contact region of the lower electrode; and a conductive plug formed in the hole and connected electrically to the lower electrode.

According to the present invention, the upper surface of the upper electrode is planarized, and the thin thickness portion having a thin thickness is not formed in the upper electrode. Therefore, the entering of the reducing substance such as the hydrogen, or the like into the capacitor dielectric film constituting the capacitor can be blocked easily by the upper electrode.

In addition, a sectional shape of the upper electrode can be stabilized because the thin thickness portion is not formed. Therefore, it can be suppressed that electric characteristics of the capacitor, such as the electrostatic capacity, are varied every cell, and a margin of the applied voltage to the capacitor can be widened.

DESCRIPTION OF THE PREFERRED EMBODIMENTS (1) Preliminary Explanation

Prior to an embodiment of the present invention, preliminary matters of the present invention will be explained hereunder.

Figure 1A:
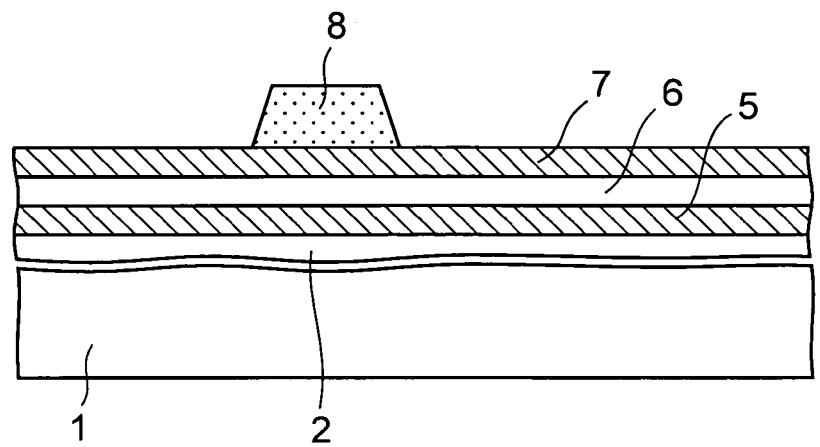
FIGS. 1A to 1C are sectional views of the first FeRAM in Preliminary Explanation in the middle of manufacture.
Figure 1B:
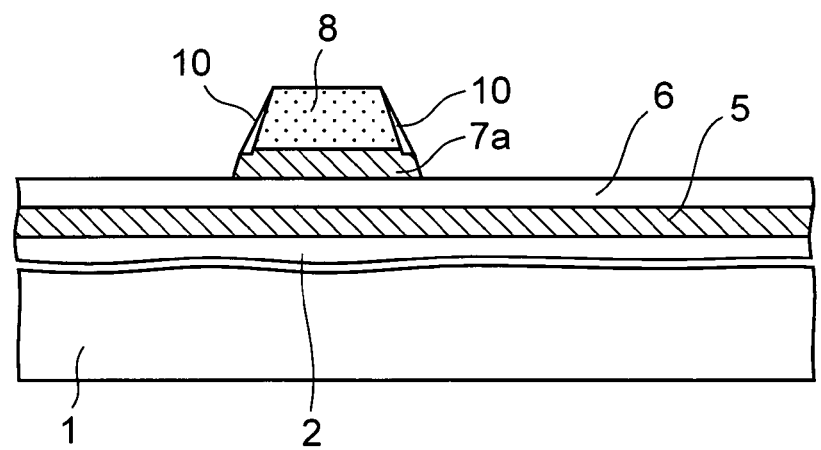
Figure 1C:
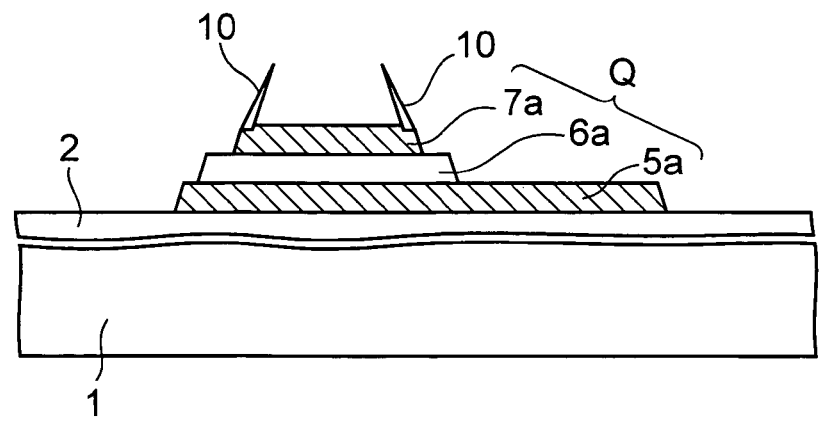

FIGS. 1A to 1C are sectional views of a virtual FeRAM in the middle of manufacture.

At first, as shown in FIG. 1A, an underlying insulating film 2 is formed over a silicon substrate 1. Then, a first conductive film 5, a ferroelectric film 6, and a second conductive film 7 are formed in this order on the underlying insulating film 2. Then, a photoresist is coated on the second conductive film 7, and then a resist pattern 8 having a profile of the capacitor upper electrode is formed by exposing/developing the photoresist. Here, typically a noble metal film such as an iridium (Ir) film, a platinum (Pt) film, or the like, or a noble metal oxide film such as an iridium oxide (IrOx) film, or the like is employed as the second conductive film 7. Also, a PZT (Lead Zirconate Titanate) film is employed as the ferroelectric film 6.

Then, as shown in FIG. 1B, the second conductive film 7 is etched by the dry etching, which uses a gas mixture consisting of a halogen gas and an inert gas as an etching gas, while using the resist pattern 8 as a mask. Thus, an upper electrode 7a is formed.

At this time, the noble metal or the noble metal oxide is discharged into the etching atmosphere by the etching. But some of the discharged material adheres onto side surfaces of the resist pattern 8 again as a re-adhered matter 10.

Then, the resist pattern 8 is removed by the ashing. In this event, since the re-adhered matter 10 adhered on the side surface of the resist pattern 8 is made of the noble metal that has a poor reactivity, such re-adhered matter cannot be removed by this ashing step. Thus, such re-adhered matter remains as it is on the edge of the upper electrode 7a like a fence.

Then, as shown in FIG. 1C, a capacitor dielectric film 6a and a lower electrode 5a are formed by patterning separately the ferroelectric film 6 and the first conductive film 5 respectively. The lower electrode 5a, the capacitor dielectric film 6a, and the upper electrode 7a constitute a ferroelectric capacitor Q.

In the above FeRAM manufacturing method, as shown in FIG. 1C, the fence-like re-adhered matter 10 still remains on the upper electrode 7a. Therefore, because of the presence of this re-adhered matter 10, it becomes difficult to form an interlayer insulating film on the ferroelectric capacitor Q with good coverage. Also, if the re-adhered matter 10 is separated from the upper electrode 7a in patterning the ferroelectric film 6 and the first conductive film 5 and then adheres again to these films 5, 6, such a problem arises that the defective pattern is generated in the area onto which the re-adhered matter 10 adhered.

Therefore, in order not to generate the re-adhered matter 10, in the etching step in FIG. 1B, the method of accelerating the chemical reaction etching by increasing a rate of a halogen gas in the etching gas to enhance an isotropy of the etching is employed.

Figure 2A:
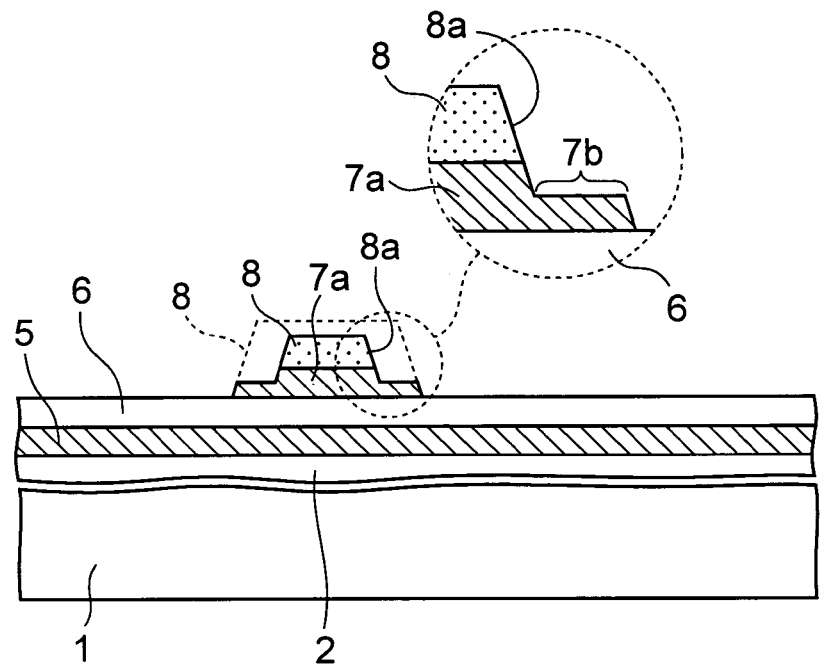
FIGS. 2A to 2C are sectional views of the second FeRAM in Preliminary Explanation in the middle of manufacture.

FIG. 2A is a sectional view of the upper electrode 7a at a point of time when the etching is ended in case the isotropy of the etching is enhanced in this manner. As shown this Figure, as the result of this enhancement of the isotropy of the etching, an etching depth on side surfaces 8a of the resist pattern 8 is increased. Therefore, there is no room for the constitutive material of the second conductive film 7 emitted into the etching atmosphere to adhere to the side surfaces 8a and thus the above re-adhered matter 10 is never generated.

Also, the resist pattern 8 shrinks during the etching because the isotropy is enhanced, and thus a peripheral portion of the upper electrode 7a is exposed from the resist pattern 8 in the course of the etching. Accordingly the upper electrode 7a on the peripheral portion is etched, and thus a thin thickness portion 7b having a small thickness is formed on the upper electrode 7a.

Figure 2B:
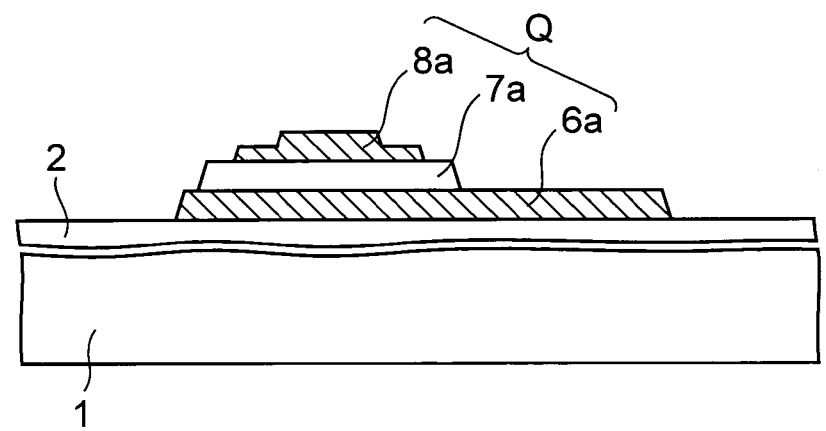

FIG. 2B is a sectional view of the capacitor Q formed by the similar method to that explained in FIG. 1C after the upper electrode 7a is patterned in this manner.

The capacitor dielectric film 6a of the capacitor Q formed in this manner is damaged by the patterning applied to respective films 5 to 7, and its ferroelectric characteristic is deteriorated. For this reason, in order to recover the capacitor dielectric film 6a from the damage, the recovery annealing is carried out in the oxygen atmosphere after the capacitor Q is formed.

Figure 2C:
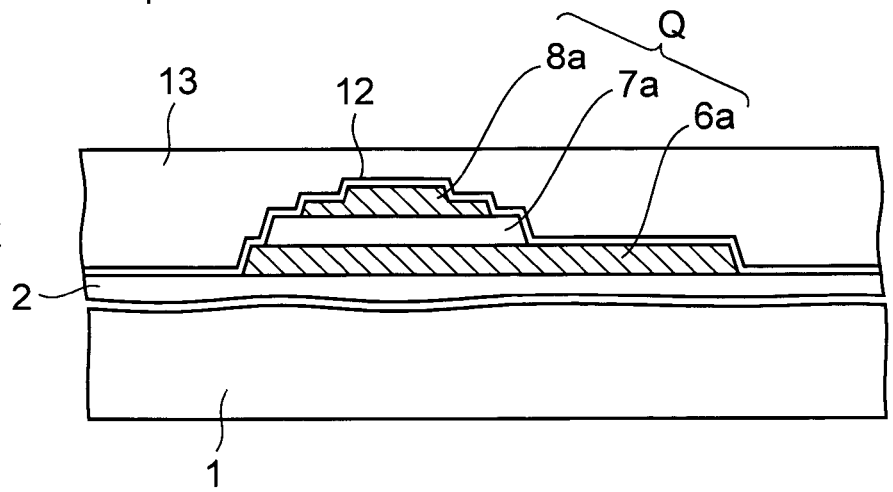

Then, as shown in FIG. 2C, after a capacitor protection insulating film 12 made of alumina is formed on an entire upper surface of the silicon substrate 1, an interlayer insulating film 13 formed of a silicon oxide film is formed on the capacitor protection insulating film 12 by the plasma CVD (Chemical Vapor Deposition) method using the TEOS (Tetraethoxysilane) gas.

By the way, it is known that the hydrogen contained in the TEOS reduces the capacitor dielectric film 6a such as PZT film to deteriorate its ferroelectric characteristic. Normally, the capacitor protection insulating film 12 and the upper electrode 7a function to block the hydrogen and protect the capacitor dielectric film 6a from the hydrogen. Hence, there is no chance that the capacitor dielectric film 6a is largely deteriorated by the hydrogen even when the capacitor Q is covered with the interlayer insulating film 13 as above.

However, as shown in FIG. 2A, when the thin thickness portion 7b is formed in the upper electrode 7a, the hydrogen is ready to transmit through the thin thickness portion 7b from the upper side. As a result, such a new problem arises that a degree of deterioration of the capacitor dielectric film 6a by the hydrogen is enhanced.

Moreover, the electric characteristics of the ferroelectric capacitor Q, such as the electrostatic capacity, are varied by the thin thickness portion 7b every cell. As a result, there is also a disadvantage that a margin of the applied voltage to the ferroelectric capacitor Q is narrowed.

In addition, in both cases in FIG. 1B and FIG. 2A, the resist pattern 8 is formed directly on the upper electrode 7a. If doing so, such a problem arises that the surface of the upper electrode 7a becomes rough when exposing the upper electrode 7a to the oxygen-containing atmosphere, e.g., when applying the recovery annealing to the capacitor dielectric film 6a. It may be considered that this problem is caused due to either the residue of the resist pattern 8, which cannot be removed from the upper electrode 7a by the ashing, or the adhesion of the lead in the PZT constituting the ferroelectric film 6 onto the upper electrode 7a when the upper electrode 7a is patterned.

In view of these problems, the inventors of this application come up with an embodiment of the present invention explained in the following.

(2) Embodiment of the Present Invention

Figure 3A:
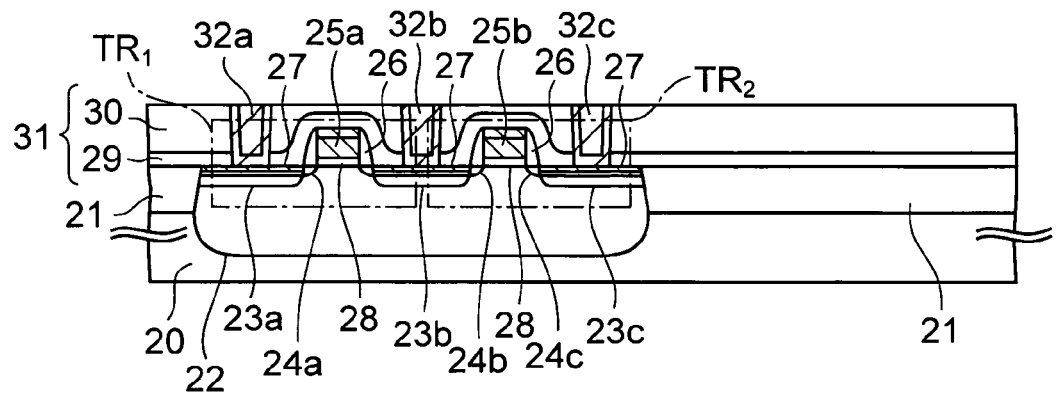
FIGS. 3A to 3R are sectional views of a semiconductor device according to an embodiment of the present invention in the middle of manufacture.
Figure 3B:
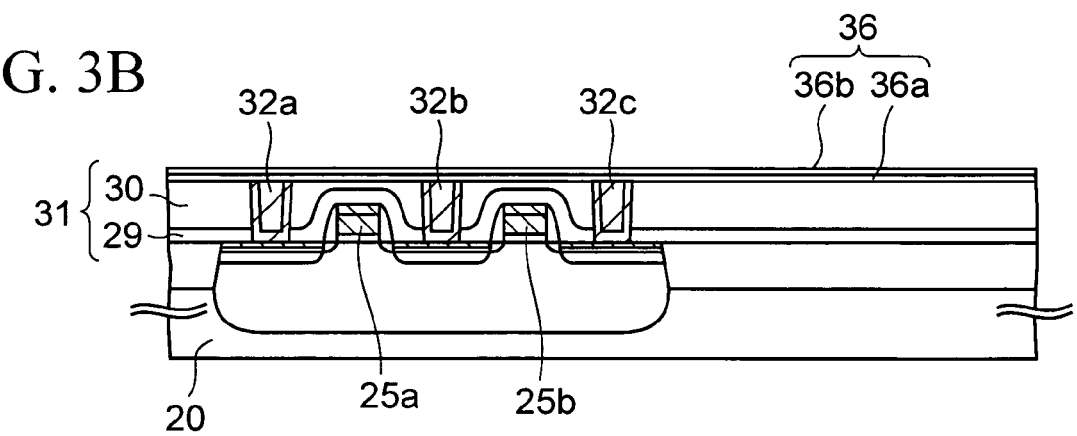
Figure 3C:
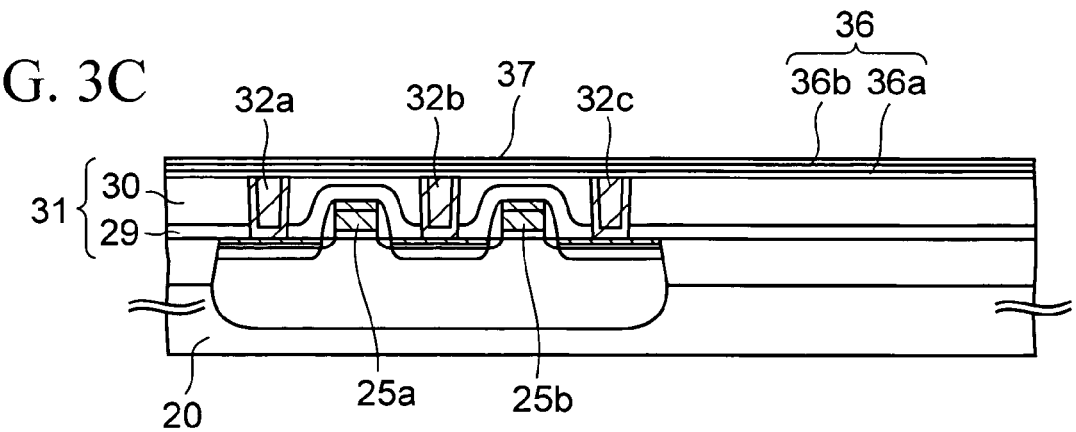
Figure 3G:
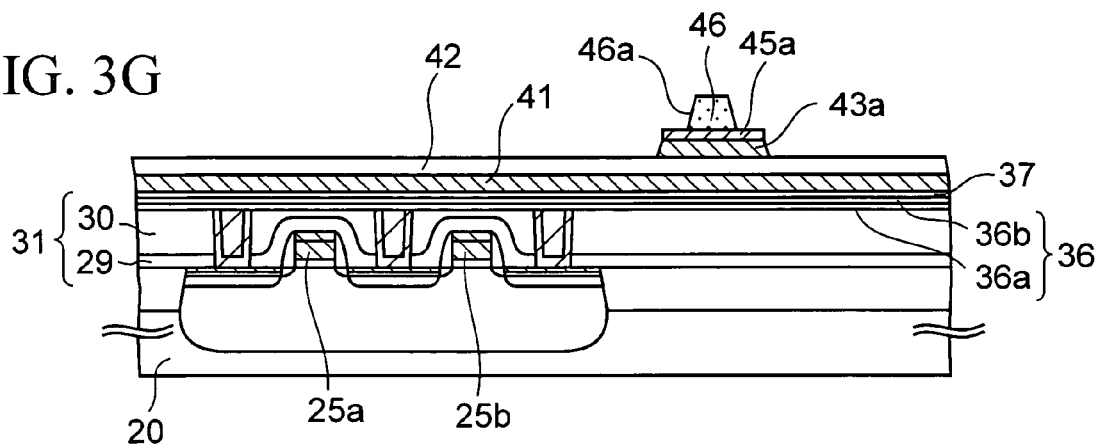
Figure 3H:
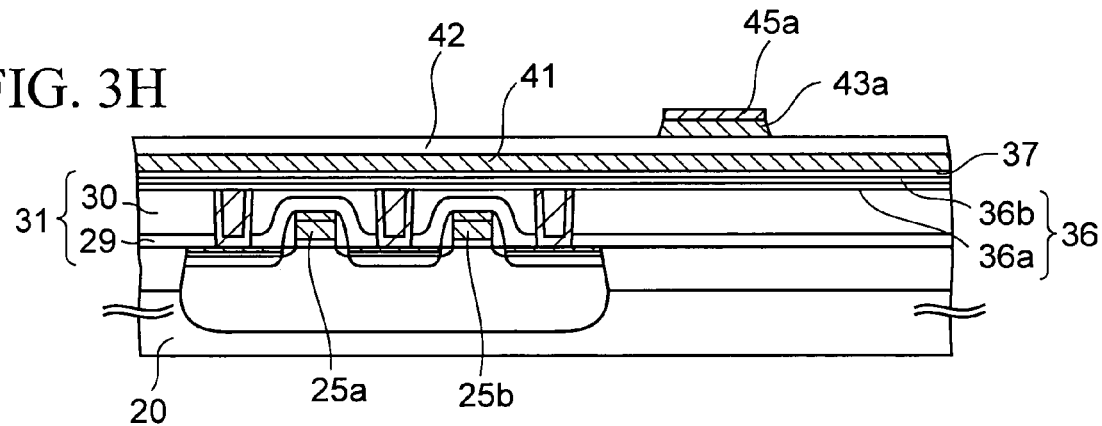
Figure 3I:
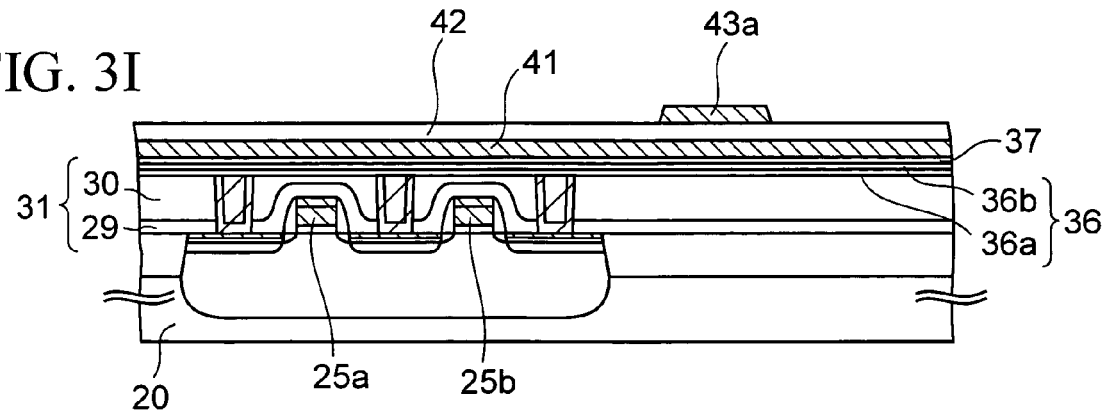
Figure 3J:
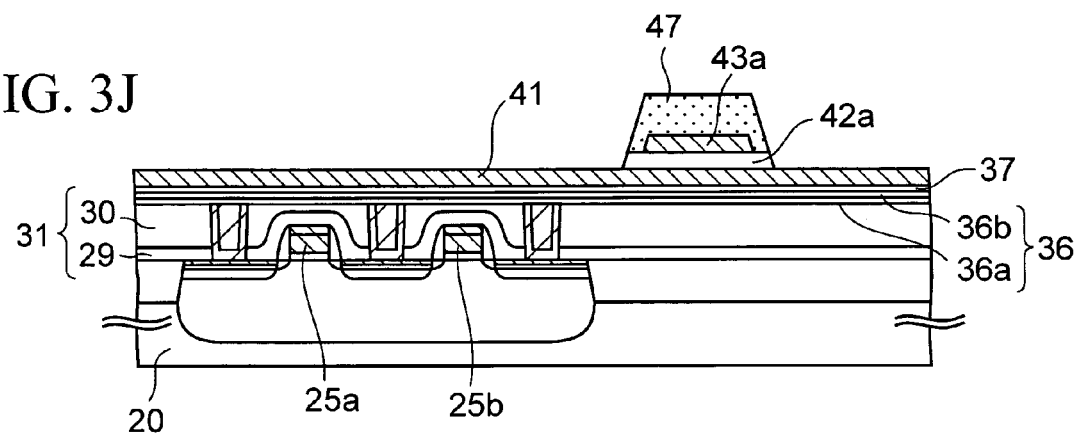
Figure 3K:
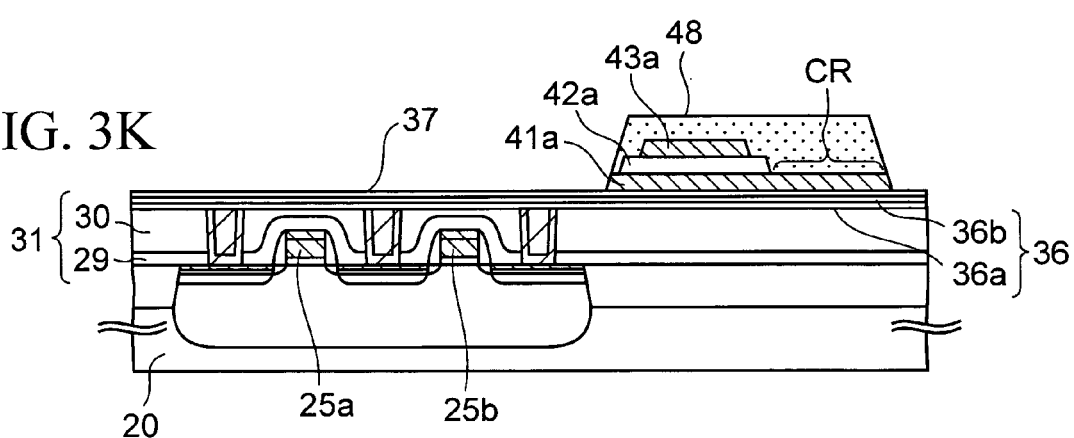
Figure 3L:
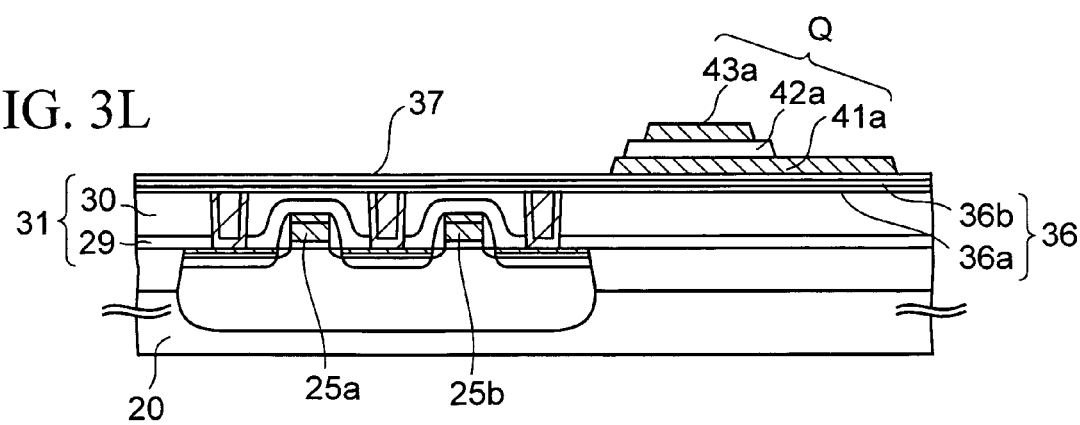
Figure 3M:
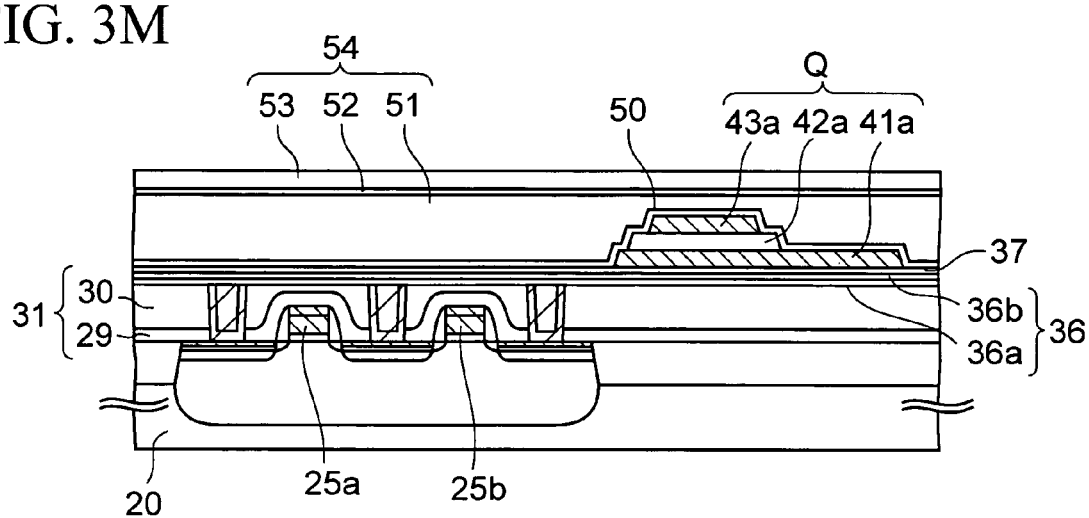
Figure 3N:
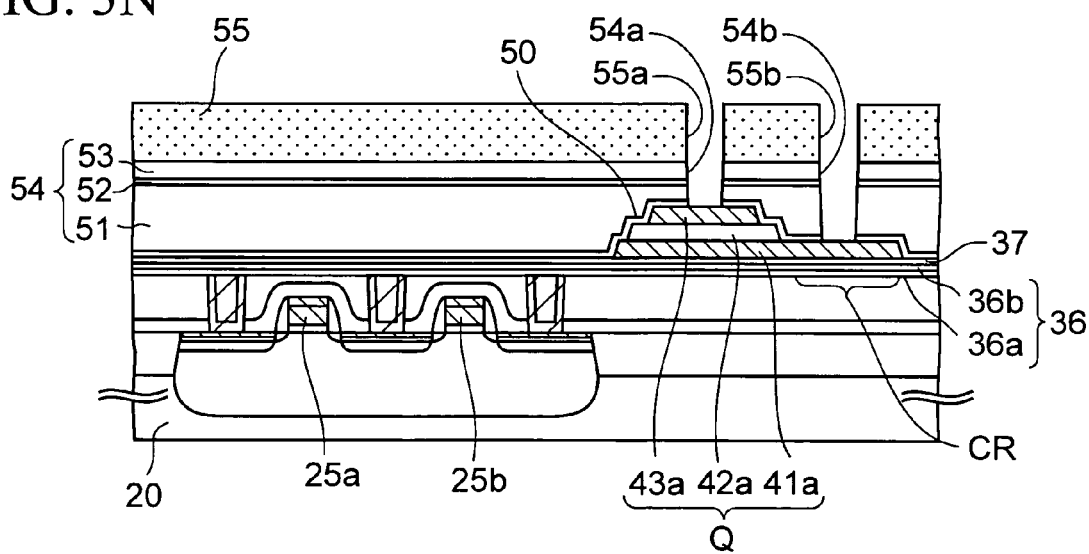
Figure 3O:
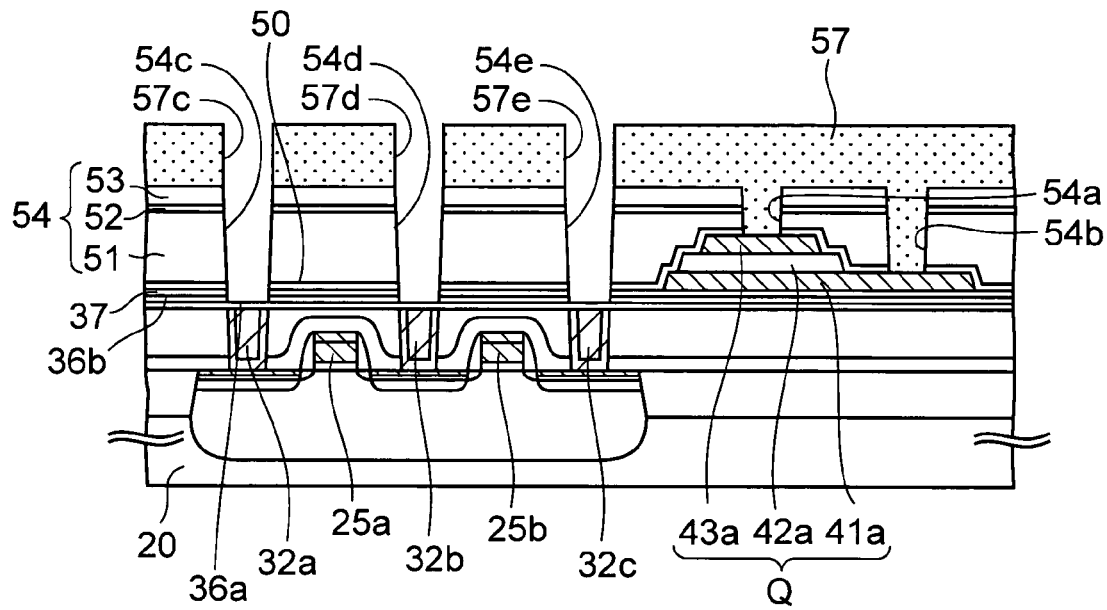
Figure 3P:
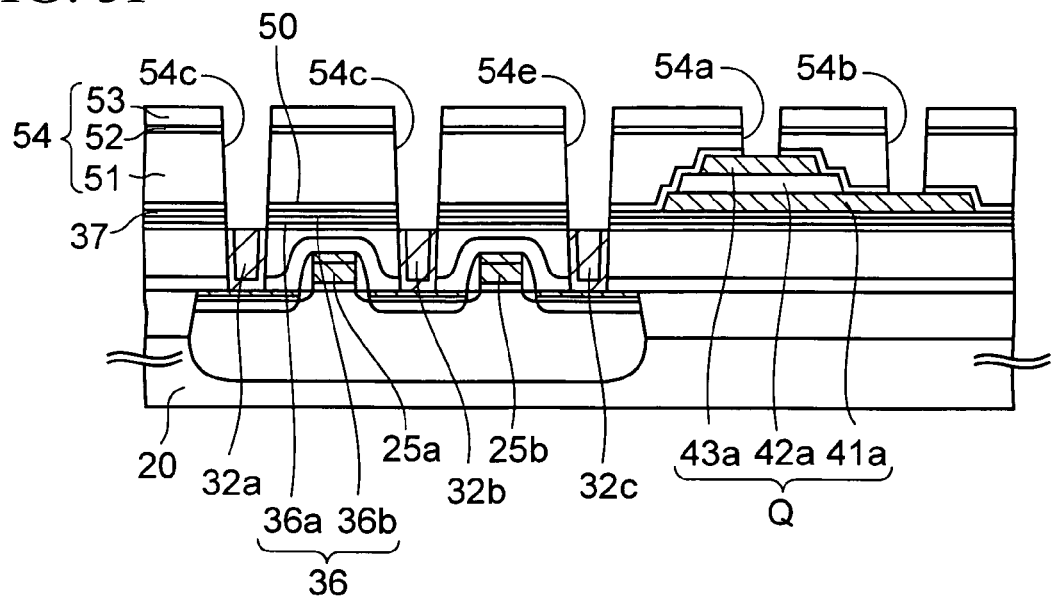
Figure 3Q:
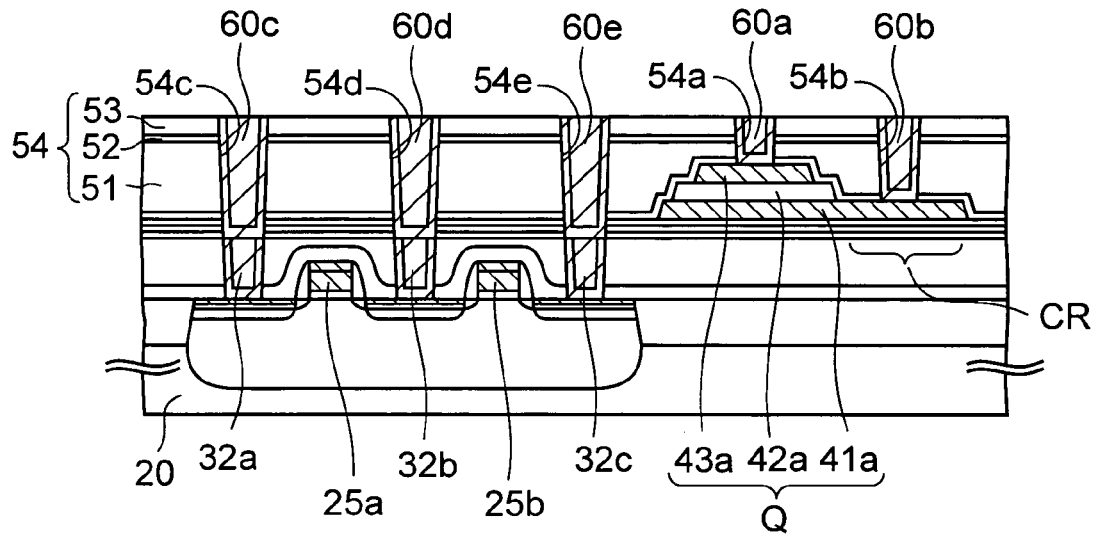
Figure 3R:
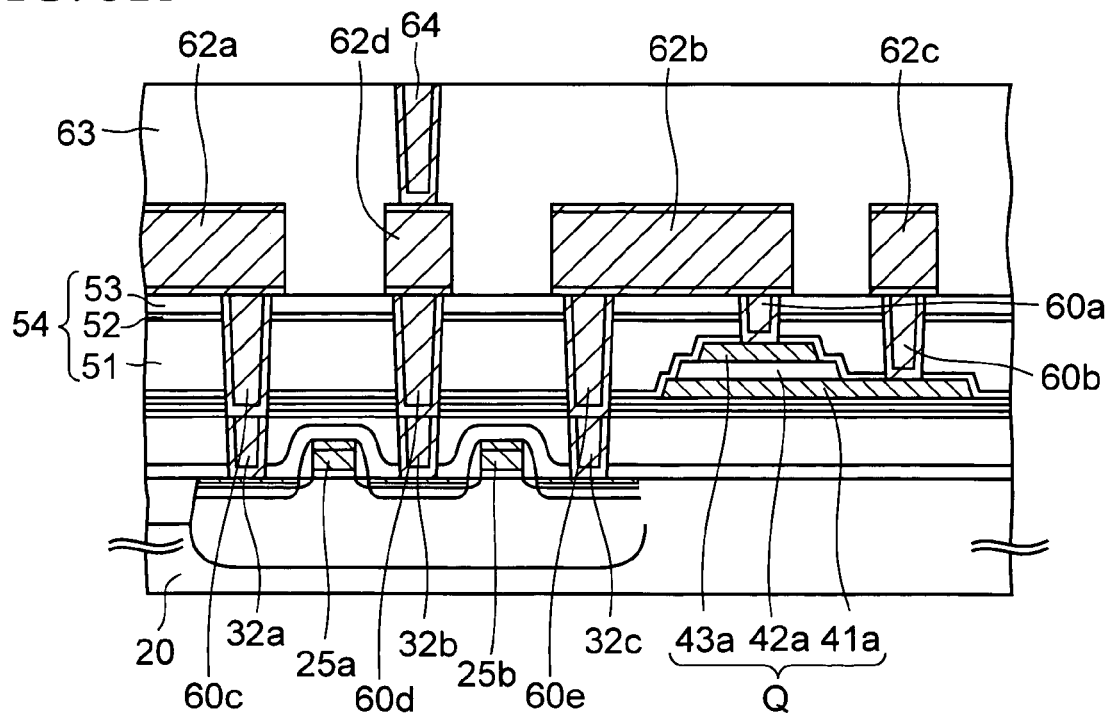

FIGS. 3A to 3R are sectional views of a semiconductor device according to an embodiment of the present invention in the middle of manufacture.

This semiconductor device is a planar FeRAM in which the conductive plug is formed on the contact region of the capacitor lower electrode.

First, steps required until a sectional structure shown in FIG. 3A is obtained will be explained hereunder.

First, an STI (Shallow Trench Isolation) trench to define an active region of the transistor is formed on a surface of an n-type or p-type silicon (semiconductor) substrate 20. Then, an element isolation insulating film 21 is formed by filling an insulating film such as silicon oxide, or the like into the trench. Here, the element isolation structure is not limited to STI, and the element isolation insulating film 21 may be formed by the LOCOS (Local Oxidation of Silicon) method.

Then, a p-well 22 is formed by introducing the p-type impurity into the active region of the silicon substrate 20. Then, a thermal oxide film serving as a gate insulating film 28 is formed by thermally oxidizing the surface of the active region.

Then, either an amorphous silicon film or a polysilicon film, and a tungsten silicide film are formed sequentially on an entire upper surface of the silicon substrate 20. Then, gate electrodes 25a, 25b are formed by patterning these films by means of the photolithography.

Two gate electrodes 25a, 25b are arranged at a distance in almost parallel on the p-well 22. These gate electrodes 25a, 25b constitute a part of the word line.

Then, the n-type impurity is introduced into the silicon substrate 20 on both sides of the gate electrodes 25a, 25b by the ion-implantation using the gate electrodes 25a, 25b as a mask, thereby forming first to third source/drain extensions 24a to 24c.

Thereafter, an insulating film is formed on the entire upper surface of the silicon substrate 20. Then, an insulating sidewall 26 is left on the side surfaces of the gate electrodes 25a, 25b by etching back the insulating film. For example, a silicon oxide film is formed by the CVD method as the insulating film.

Then, the n-type impurity is ion-implanted once again into the silicon substrate 20, while using the insulating sidewalls 26 and the gate electrodes 25a, 25b as a mask. Thus, first to third source/drain regions 23a to 23c are formed on the sides of the gate electrodes 25a, 25b on the silicon substrate 20.

With the steps performed up to now, first and second MOS transistors $TR_1$, $TR_2$ consisting of the gate insulating film 28, the gate electrodes 25a, 25b, and the first to third source/drain regions 23a to 23c are formed on the active region of the silicon substrate 20.

Next, a refractory metal silicide layer such as a cobalt layer is formed on the entire upper surface of the silicon substrate 20 by the sputter method. Then, a refractory metal silicide layer 27 is formed on the silicon substrate 20 by heating this refractory metal silicide layer to react with the silicon. This refractory metal silicide layer 27 is also formed on surface layer portions of the gate electrodes 25a, 25b, and the resistance of the gate electrodes 25a, 25b is thereby lowered.

Thereafter, the unreacted refractory metal layer on the element isolation insulating film 21, etc. is removed by the wet etching.

Next, a silicon nitride (SiN) film 29 of about 20 nm thickness is formed by the plasma CVD method. Then, a silicon oxide film 30 of about 80 nm thickness is formed on the silicon nitride film 29 by the plasma CVD method using the silane gas. After that, a sacrifice silicon oxide film of about 1000 nm thickness is formed thereon by the plasma CVD method using the TEOS gas. Then, an upper surface of the sacrifice silicon oxide film is polished and planarized by the CMP (Chemical Mechanical Polishing) method. Thus, the silicon oxide film 30 and the silicon nitride film 29 being still left constitute a first interlayer insulating film 31. As the result of this CMP, a thickness of the first interlayer insulating film 31 has a thickness of about 700 nm on the flat surface of the silicon substrate 20.

Next, a contact hole is formed on the first to third source/drain regions 23a to 23c respectively by patterning the first interlayer insulating film 31 by means of the photolithography. Then, a titanium film of about 30 nm thickness and a titanium nitride film of about 20 nm thickness are formed in this order as a glue film on inner surfaces of the contact holes and an upper surface of the first interlayer insulating film 31 by the sputter method. Theraxfter, a tungsten film is formed on the glue film by the CVD method using a tungsten hexafluoride gas, so that the contact holes are completely buried with the tungsten film. Next, the extra tungsten film and the extra glue film on the first interlayer insulating film 31 are polished and removed by the CMP method, and first to third conductive plugs 32a to 32c are left in the contact holes. These first to third conductive plugs 32a to 32c are connected electrically to the underlying first to third source/drain regions 23a to 23c respectively.

Meanwhile, the first to third conductive plugs 32a to 32c are formed mainly of the tungsten, which is very readily oxidized and causes the defective contact when such tungsten is oxidized during the process.

Therefore, in subsequent step, as shown in FIG. 3B, as an oxidation preventing film 36 for protecting the first to third conductive plugs 32a to 32c from the oxidizing atmosphere, a silicon oxide nitride (SiON) film 36a and a silicon oxide film 36b are formed in this order by the plasma CVD method. A thickness of the silicon oxide nitride (SiON) film 36a is set to 100 nm, for example, and a thickness of the silicon oxide film 36b is set to about 130 nm. Also, the TEOS is employed as a film forming gas for the silicon oxide film 36b.

Then, as shown in FIG. 3C, in order to increase the crystallinity of the lower electrode of the ferroelectric capacitor described later and to improve the crystallinity of the capacitor dielectric film, a first alumina film (underlying insulating film) 37 of about 20 nm thickness is formed by the putter method.

Next, steps required until a sectional structure shown in FIG. 3D is obtained will be explained hereunder.

First, a platinum film of about 150 nm thickness is formed by the sputter method as a first conductive film 41.

Then, a PZT film of about 150 nm thickness is formed on the first conductive film 41 as a ferroelectric film 42 by the sputter method. As the method of forming the ferroelectric film 42, there are the MOCVD (Metal Organic CVD) method, the sol-gel method, and the like, in addition to the sputter method. Furthermore, the material of the ferroelectric film 42 is not limited to the above PZT. This ferroelectric film 42 may be formed of the Bi layer-structure compound such as $SrBi_2Ta_2O_9$, $SrBi_2(Ta,Nb)_2O_9$, or the like, PLZT formed by doping the lanthanum into PZT, or other metal oxide ferroelectric substance.

Next, the PZT constituting the ferroelectric film 42 is crystallized in the oxygen-containing atmosphere by RTA (Rapid Thermal Annealing). A substrate temperature of 720° C., a process time of 120 second, and a programming rate of 125° C./sec are employed as the RTA conditions.

Thereafter, an iridium oxide ($IrO_2$) film of about 250 nm thickness is formed on the ferroelectric film 42 by the sputter method, and the iridium oxide film is used as a second conductive film 43. This second conductive film 43 may be formed of a noble metal film or a noble metal oxide film. In place of the iridium oxide film, the noble metal film such as an iridium film, a platinum film, or the like may be formed as the second conductive film 43.

Then, as shown in FIG. 3E, a titanium nitride (TiN) film is formed by the sputter method to have a thickness of less than 50 nm, preferably a thickness of 20 to 50 nm, more preferably a thickness of 30 nm, and the titanium nitride film thus formed is used as a mask material film 45. This mask material film 45 is not particularly limited as long as its etching rate is lower than the resist. For example, a titanium nitride aluminum (TiNAl) film may be formed as the mask material film 45 in place of the titanium nitride film.

Then, a photoresist is coated on the mask material film 45, and then a first resist pattern 46 having a planar shape of the capacitor upper electrode is formed by exposing/developing the photoresist.

Next, steps required until a sectional structure shown in FIG. 3F is obtained will be explained hereunder.

Figure 4:
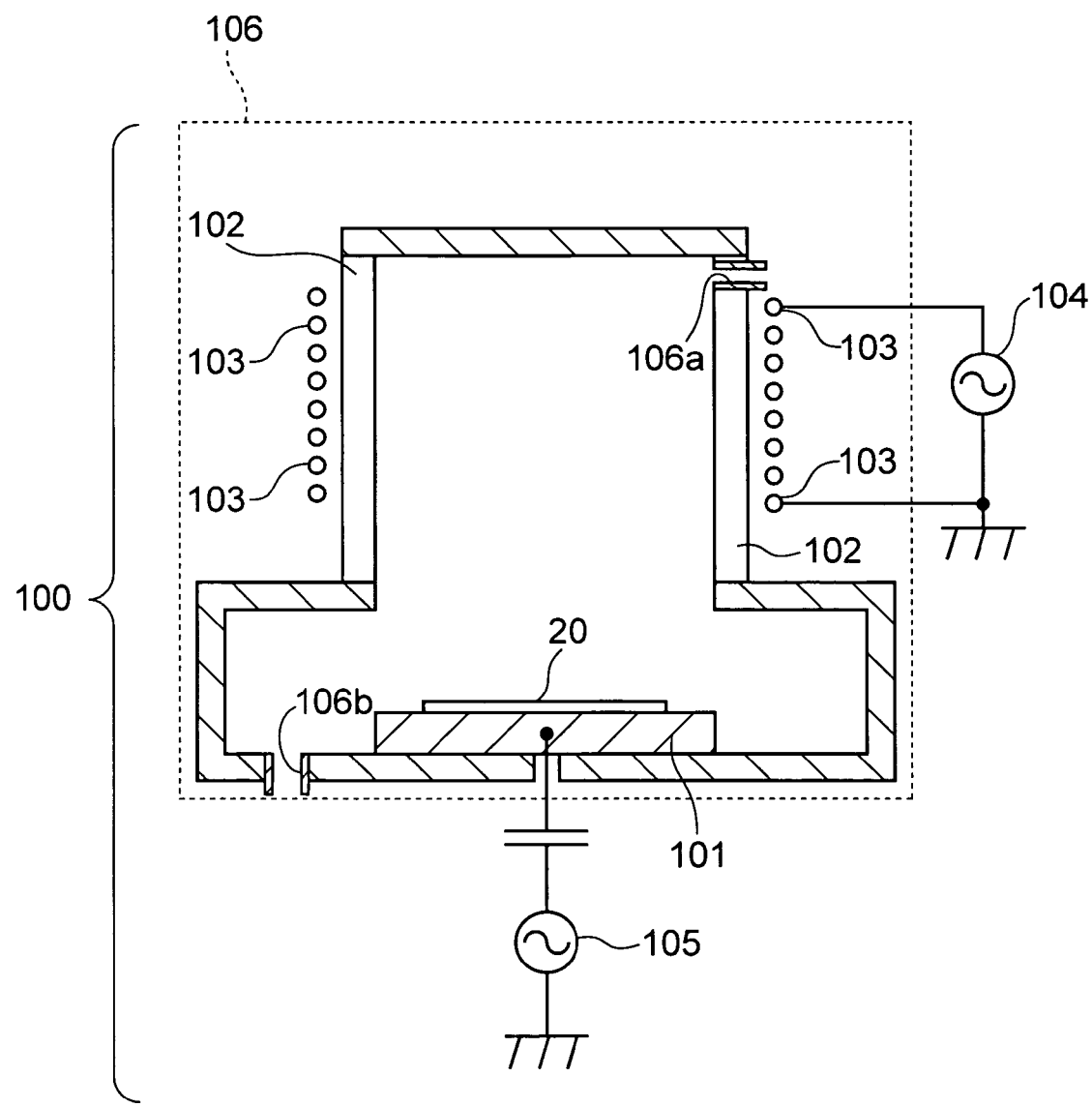
FIG. 4 is a configurative view of an ICP etching equipment used in the embodiment of the present invention.

FIG. 4 is a configurative view of an ICP (Inductively Coupled Plasma) etching equipment 100 used in these steps.

In this ICP etching equipment 100, a side wall 102 of a chamber 106 is made of the quartz ($SiO_2$), and an antenna coil 103 for generating the plasma in the chamber 106 is wound around the side wall 102. A first high-frequency power supply 104 whose frequency is 13.56 MHz, for example, is connected to the antenna coil 103.

On the other hand, a substrate loading table 101 for loading the silicon substrate 20 thereon is provided to the bottom portion of the chamber 106. A second high-frequency power supply 105 for generating a bias voltage to attract the ion seeds in the chamber 106 to the silicon substrate 20 is coupled to the substrate loading table 101. A frequency of the second high-frequency power supply 105 is not particularly limited, but the frequency is set to 460 kHz in the present embodiment.

Further, a gas introduce port 106a and a gas exhaust port 106b are provided to the chamber 106. The gas introduce port 106a introduces the etching gas into the chamber 106. The gas exhaust port 106b exhausts the gas to reduce a pressure in the chamber 106 into a predetermined pressure.

In the step in FIG. 3F, the mask material film 45 is dry-etched by using the first resist pattern 46 as a mask in the ICP etching equipment 100, while using a gas mixture consisting of a halogen gas and an inert gas as the etching gas. The mask material film 45 being not etched and still left is used as an auxiliary mask 45a having the upper electrode shape. In the present embodiment, a chlorine gas and an argon gas, whose flow rate is set to 80 sccm respectively, are used as the halogen gas and the inert gas. Although the etching conditions are not limited, a pressure of 0.7 Pa, a power of the first high-frequency power supply 104 of 500 to 1200 W, and a power of the second high-frequency power supply 105 of 50 to 400 W are employed as the etching conditions.

Then, as shown in FIG. 3G, the second conductive film 43 is etched by using the ICP etching equipment 100 explained in FIG. 4, while using the auxiliary mask 45a and the first resist pattern 46 as a mask. Thus, the second conductive film 43 is shaped into an upper electrode 43a.

At this time, if the constitutive material of the etched second conductive film 43, e.g., the iridium oxide, is adhered onto a side surface 46a of the first resist pattern 46 again, the re-adhered matter remains on the upper electrode 43a like a fence after the first resist pattern 46 is removed.

Therefore, in this etching, it is preferable that the adhesion of the re-adhered matter onto the side surface 46a is prevented by enhancing the isotropy of the etching such that the side surface 46a of the first resist pattern 46 goes back. Such etching can be carried out by employing the etching gas that is prepared by adding the halogen gas, which enhances the isotropy of the etching by the chemical reaction, to the inert gas, which plays a role of sputtering factor in the etching.

In the present embodiment, chlorine and argon are used as the halogen gas and the inert gas respectively, and a flow rate of the chlorine gas is set to 10 sccm and a flow rate of the argon gas is set to 50 sccm. Although the etching conditions except the above are not particularly limited, a pressure of 0.7 Pa, a power of the first high-frequency power supply 104 (see FIG.

4) of 2100 W, and a power of the second high-frequency power supply 105 of 1400 W are employed as the etching conditions.

In the present embodiment, since the etching whose isotropy is enhanced in this fashion is employed, the upper electrode 43a can be formed while suppressing the event that the re-adhered matter in the etching is left.

By the way, a thickness of the auxiliary mask 45a serving as a mask of this etching is thin like about 20 to 50 nm. Therefore, if an etching rate of the auxiliary mask 45a is rapid, such a problem arises that the auxiliary mask 45a disappears before the patterning of the upper electrode 43a is completed.

In order to avoid such disadvantage, the side wall 102 of the chamber 106 shown in FIG. 4 is constructed from the quartz ($SiO_2$) in the present embodiment, thereby sputtering the quartz by argon gas and thus introducing a small amount of oxygen from the quartz to the etching atmosphere, and thus oxidizing the upper surface of the auxiliary mask 45a by oxygen and lowering the etching ratio of the auxiliary mask 45a.

In order to effectively obtain such advantage, it is preferable to set the flow rate of the argon gas, which sputter the quartz, equal to or greater than that of chlorine gas. For example, flow rate ratio of the argon gas is preferable to set 60% or more in the etching gas.

Then, as shown in FIG. 3H, the first resist pattern 46 remaining on the auxiliary mask 45a is removed by the ashing using the oxygen plasma.

Accordingly, the upper surface of the auxiliary mask 45a is exposed completely. However, the auxiliary mask 45a is used in patterning the upper electrode 43a and is not needed in subsequent steps. If the auxiliary mask 45a still remains on the upper electrode 43a, the auxiliary mask 45a made of TiN is oxidized in the process performed in the oxygen-containing atmosphere, e.g., in the recovery annealing of the ferroelectric capacitor described later. If this is the case, the auxiliary mask 45a is formed into the insulating material. Therefore, if the conductive plug is formed on the auxiliary mask 45a, the conductive plug cannot be connected electrically to the upper electrode 43a, so that it becomes impossible to control a voltage of the upper electrode 43a.

Therefore, as shown in FIG. 3I, the silicon substrate 20 is dipped into the etchant that is formed of a mixed solution consisting of a hydrogen peroxide ($H_2O_2$) solution, whose concentration is 30 wt %, and an ammonium hydroxide ($NH_4OH$) solution, whose concentration is 30 wt %. Thus, the auxiliary mask 45a is removed at an ordinary temperature by the wet etching. Here, a mixing ratio of the etchant is not particularly limited. In the present embodiment, a mixing ratio of hydrogen peroxide:ammonium hydroxide:pure water=3:1:10 is employed.

Also, if the wet etching is carried out while stirring the inside of a tank in which the etchant is filled by a pump, the auxiliary mask 45a is stably removed.

As the result of such etching, the organic etching residue remains on the upper electrode 43a in some cases. Hence, it is preferable that such etching residue is removed by exposing the surface of the upper electrode 43a to the oxygen plasma in the ashing equipment.

With the above, a clean surface of the upper electrode 43a is exposed.

Next, as shown in FIG. 3J, a second resist pattern 47 having a shape of the capacitor dielectric film is formed on the upper electrode 43a. Then, the ferroelectric film 42 is etched by the dry etching while using the second resist pattern 47 as a mask, and the remaining ferroelectric film 42 is used as a capacitor dielectric film 42a.

Thereafter, the second resist pattern 47 is removed.

Then, as shown in FIG. 3K, a third resist pattern 48 having a shape of the lower electrode is formed on the upper electrode 43a and the first conductive film 41. After that, the first conductive film 41 is etched by the dry etching while using the third resist pattern 48 as a mask, and the remaining first conductive film 41 is used as a lower electrode 41a. A portion of the lower electrode 41a, which extends from the capacitor dielectric film 42a, functions as a contact region CR.

Thereafter, the third resist pattern 48 is removed. Thus, as shown in FIG. 3L, a ferroelectric capacitor Q consisting of the lower electrode 41a, the capacitor dielectric film 42a, and the upper electrode 43a is formed on the first alumina film 37.

Next, steps required until a sectional structure shown in FIG. 3M is obtained will be explained hereunder.

First, a second alumina film 50 for protecting the capacitor Q from the reducing atmosphere such as hydrogen to prevent the degradation of the capacitor dielectric film 42a is formed on the entire upper surface of the silicon substrate 20. This second alumina film 50 is formed by the sputter method, for example, to have a thickness of about 50 nm.

Next, in order to recover the damage of the capacitor dielectric film 42a caused by the steps such as the etching, the sputtering, and the like performed up to now, the recovery annealing is applied to the capacitor dielectric film 42a under conditions of a substrate temperature of 650° C. and a processing time of 90 min in the 100% oxygen atmosphere in a furnace.

Next, a silicon oxide film 51 of about 1500 nm thickness is formed on the second alumina film 50 by the plasma CVD method using the TEOS gas as a reaction gas. Concavity and convexity due to the capacitor Q are formed on an upper surface of the silicon oxide film 51. In order to eliminate such irregularities, an upper surface of the silicon oxide film 51 is polished and planarized by the CMP method. Thus, a thickness of the silicon oxide film 51 on the flat surface of the second alumina film 50 is set to about 1000 nm.

Thereafter, as the dehydrating process of the silicon oxide film 51, the surface of the silicon oxide film 51 is exposed to the $N_2O$ plasma. In place of the $N_2O$ plasma process, the silicon oxide film 51 may be annealed in the furnace for the dehydration.

Next, in order to protect the capacitor Q from hydrogen or water generated in the later steps, a third alumina film 52 of about 50 nm thickness is formed on the silicon oxide film 51 by the sputter method. Then, a silicon oxide film 53 of about 200 nm thickness is formed on the third alumina film 52 by the plasma CVD method.

With the steps applied until now, a second interlayer insulating film 54 consisting of the silicon oxide films 51, 53 and the third alumina film 52 is formed on the capacitor Q.

Next, as shown in FIG. 3N, photoresist is coated on the second interlayer insulating film 54, and by exposing and developing the photoresist, a fourth resist pattern 55 having first and second windows 55a, 55b of a hole shape is formed.

Then, the second interlayer insulating film 54 and the underlying second alumina film 50 are etched via the first and second windows 55a, 55b. Thus, a first hole 54a is formed on the upper electrode 43a and also a second hole 54b is formed on the contact region CR of the lower electrode 41a.

Thereafter, the fourth resist pattern 55 is removed.

Next, as shown in FIG. 3O, a photoresist is coated on the second interlayer insulating film 54 again, and by exposing and developing the photoresist, a fifth resist pattern 57 having third to fifth windows 57c to 57e on the first to third conductive plugs 32a to 32c respectively is formed.

Further, the second interlayer insulating film 54, the first and second alumina films 37, 50 and the silicon oxide film 36b are etched via the third to fifth windows 57c to 57e. Thus, third to fifth holes 54c to 54e are formed on the first to third conductive plugs 32a to 32c. Such etching is performed in the parallel plate type plasma etching equipment using a gas mixture consisting of $C_4F_8$, Ar, $O_2$, and CO as the etching gas, and the silicon oxide nitride (SiON) film 36a acts as the stopper film in this etching.

Thereafter, the fifth resist pattern 57 is removed.

Next, steps required until a sectional structure shown in FIG. 3P is obtained will be explained hereunder.

First, the silicon substrate 20 is put into the parallel plate type plasma etching equipment, and a gas mixture consisting of $CHF_3$, Ar, and $O_2$ is supplied into the etching equipment as the etching gas. According to this, the silicon oxide nitride (SiON) film 36a under the third to fifth holes 54c to 54e is etched, and the first to third conductive plugs 32a to 32c are exposed in these holes. At the same time, extraneous substance in the first and second holes 54a, 54d is removed, and upper surfaces of the upper electrode 43a and the lower electrode 41a are cleaned.

In this manner, third to fifth holes 54c to 54e, which are formed with deep depth over the first to third source/drain regions 23a to 23c, are formed in the different step from the step of forming the shallow first and second holes 54a, 54b over the capacitor Q. Therefore, it can be prevented that the upper electrode 43a under the shallow first hole 54a is exposed to the etching atmosphere for a long time, and hence it can be suppressed that the capacitor dielectric film 42a under the electrode is deteriorated.

In addition, the first to third conductive plugs 32a to 32c are covered with the silicon oxide nitride film 36a constituting the oxidation preventing film 36 until the present step is completed. Therefore, it can be prevented that the tungsten constituting the conductive plugs 32a to 32c is oxidized to cause the defective contact.

Next, steps required until a sectional structure shown in FIG. 3Q is obtained will be explained hereunder.

First, in order to clean the inner surfaces of the first to fifth holes 54a to 54e, the inner surfaces of holes 54a to 54e are exposed to the argon atmosphere that is plasmanized by the high-frequency power, thereby sputter-etching the inner surfaces. The etching amount is set to about 10 nm in terms of film thickness of the silicon oxide film. Then, a titanium nitride film of about 75 nm thickness is formed as the glue film on inner surfaces of the first to fifth holes 54a to 54e and an upper surface of the second interlayer insulating film 54 by the sputter method.

Next, the tungsten film is formed on the glue film by the CVD method, and thus the first to fifth holes 54a to 54e are buried completely by the tungsten film.

Thereafter, the extra glue film and the extra tungsten film on the upper surface of the second interlayer insulating film 54 are polished and removed by the CMP method, thereby leaving these films in the first to fifth holes 54a to 54e. These films left in the first and second holes 54a, 54b constitute fourth and fifth conductive plugs 60a, 60b that are electrically connected to the upper electrode 43a and the contact region CR of the lower electrode 41a respectively. Also, above films left in the third to fifth holes 54c to 54e constitute sixth to eighth conductive plugs 60c to 60e that are electrically connected to the first to third conductive plugs 32a to 32c respectively.

Next, steps required until a sectional structure shown in FIG. 3R is obtained will be explained hereunder.

First, a titanium film of about 60 nm thickness and a titanium nitride film of about 30 nm thickness are formed in this order on the second interlayer insulating film 54 and on the sixth to eighth conductive plugs 60c to 60e by the sputter method respectively. These films constitute a barrier metal layer. Then, a copper-containing aluminum film of about 360 nm thickness, a titanium film of about 5 nm thickness, and a titanium nitride film of about 70 nm thickness are formed in this order as a metal-layered film on the barrier metal layer by the sputter method respectively.

Next, a silicon oxide nitride film (not shown) is formed on the metal-layered film as a reflection preventing film. Then, first-layer metal wirings 62a to 62c and a conductive pad 62d are formed by patterning the metal-layered film and the barrier metal layer by means of the photolithography.

Then, a silicon oxide film is formed as a third interlayer insulating film 63 by the plasma CVD method, and then the third interlayer insulating film 63 is planarized by the CMP method. Then, a hole is formed on the conductive pad 62d by patterning the third interlayer insulating film 63 by virtue of the photolithography, and a ninth conductive plug 64 made mainly of the tungsten film is formed in the hole.

After completing these steps, the process goes to the steps of forming second-layer to fifth-layer metal wirings and interlayer insulating films between these metal wirings, but their details will be omitted herein.

With the above, a basic structure of the planar-type FeRAM according to the present embodiment is completed.

According to the above FeRAM manufacturing method, as explained in FIG. 3G, the first resist pattern 46 and the auxiliary mask 45a are used as the etching mask for the upper electrode 43a, where the etching rate of the auxiliary mask 45a being smaller than that of the first resist pattern 46, and hence the thickness of the auxiliary mask 45a being hard to be reduced. As a result, whole of the upper surface of the upper electrode 43a is covered with the auxiliary mask 45a after the etching is completed. Therefore, such a situation can be prevented that the upper surface of the upper electrode 43a is etched to cause the thin thickness portion, as explained in Preliminary Explanation.

Figure 5:
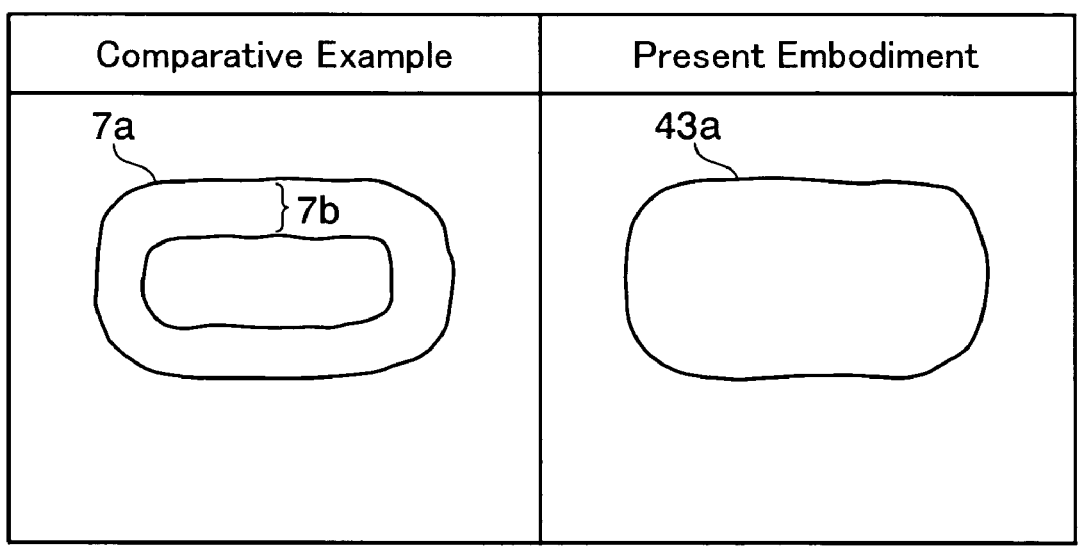
FIG. 5 is plan views depicted based on images of respective upper electrodes observed under the SEM after the oxygen annealing is applied to respective upper electrodes in the embodiment of the present invention and Comparative Example.

FIG. 5 is a plan view depicted based on an image obtained by observing the upper electrode 43a using the SEM (Scanning Electron Microscope) after the oxygen annealing is performed for the upper electrode 43a. Here, in FIG. 5, the SEM image of the upper electrode 7a explained in Preliminary Explanation is also depicted as Comparative Example. embodiment As shown in FIG. 5, in Comparative Example, the peripheral portion of the upper electrode 7b is reduced in film thickness along with a reduction of the resist pattern 8 (see FIG. 2A), and thus the thin thickness portion 7b is formed in the upper electrode 7a.

In contrast, in the present embodiment, since the peripheral portion of the upper electrode 7b is not reduced in film thickness, the above thin thickness portion is not formed on the upper electrode 43a.

Accordingly, it is possible to sufficiently maintain the thickness of the upper electrode 43a in its all portion, thereby making it easy to prevent reducing substance, such as the hydrogen, from entering into the capacitor dielectric film 42a of the capacitor (see FIG. 3Q) by the upper electrode 43a.

In addition, because the thin thickness portion explained in Preliminary Explanation is not formed, a sectional shape of the upper electrode 43a can be stabilized. Therefore, it can be suppressed that the electric characteristics of the capacitor Q, such as the electrostatic capacity, are varied every cell, and thus a margin of the applied voltage to the ferroelectric capacitor Q can be widened.

Further, because the halogen gas is added into the etching gas during the etching (see FIG. 3G) of the upper electrode 43a, the side surface of the first resist pattern 46 goes back in the etching. Accordingly, it can be prevented that the constitutive material of the upper electrode 43a emitted into the etching atmosphere adheres onto the side surface of the first resist pattern 46, and thus it can be prevented that the re-adhered material of the etching, such as those explained in Preliminary Explanation, remains on the upper electrode 43a. As a result, not only the pattern failure of the capacitor dielectric film 42a and the lower electrode 41a due to the re-adhered materials can be prevented, but also reduction in a coverage of the second interlayer insulating film 54 (see FIG. 3M) due to the re-adhered material can be prevented.

Furthermore, as shown in FIG. 3G, contact between the first resist pattern 46 and the upper electrode 43a is prevented by the auxiliary mask 45a. Therefore, even when the upper electrode 43a is exposed to the oxygen-containing atmosphere like the recovery annealing applied to the capacitor dielectric film 42a, the upper surface of the upper electrode 43a does not becomes rough.

According to these features, in the present embodiment, the upper electrode 43a without the thin thickness portion and the surface roughness and with the planarized upper surface can be formed. As a result, reduction in a yield due to the upper surface roughness of the upper electrode 43a and the film thickness reduction of the peripheral portion can be avoided, and also electric contact between the upper electrode 43a and the metal wiring 62b can be provided stably.

Furthermore, a thickness of the auxiliary mask 45a is made thinner than 50 nm or less. Therefore, in the step in FIG. 3I, the auxiliary mask 45a is readily removed by the wet etching.

According to the present invention, the upper electrode is formed by etching the second conductive film while using the auxiliary mask as a mask. Therefore, it can be prevented that the thin thickness portion is formed in the upper electrode due to the reduction in the film thickness of the mask, and a thickness of the upper electrode can be ensured sufficiently. As a result, the entering of the reducing substance, such as hydrogen, into the capacitor dielectric film can be blocked by the upper electrode, and also variation in the electric characteristics of the capacitor can be suppressed, so that the high-grade FeRAM can be provided.

What is claimed is:

1. A semiconductor device manufacturing method, comprising:
    forming an underlying insulating film on a semiconductor substrate;
    forming a first conductive film, a ferroelectric film, and a second conductive film in sequence on the underlying insulating film;
    forming a mask material film on the second conductive film;
    forming a resist pattern on the mask material film;
    shaping the mask material film into an auxiliary mask, by etching the mask material film while using the resist pattern as a mask;
    shaping the second conductive film into an upper electrode, by subjecting the second conductive film to an isotropic etching while using the auxiliary mask and the resist pattern as a mask;
    removing the resist pattern;
    removing the auxiliary mask;
    shaping the ferroelectric film into a capacitor dielectric film by patterning; and
    shaping the first conductive film into a lower electrode by patterning the first conductive film, whereby constructing a capacitor from the lower electrode, the capacitor dielectric film, and the upper electrode.

2. A semiconductor device manufacturing method, according to claim 1, wherein a gas mixture consisting of a halogen gas and an inert gas is used as an etching gas in the etching of the second conductive film.

3. A semiconductor device manufacturing method, according to claim 1, wherein the etching of the second conductive film is performed by using an ICP (Inductively Coupled Plasma) etching equipment in which a quartz is employed as at least a part of a chamber.

4. A semiconductor device manufacturing method, according to claim 3, wherein the quartz constitutes a side wall of the chamber.

5. A semiconductor device manufacturing method, according to claim 3, wherein a gas mixture consisting of a halogen gas and an inert gas is supplied to the chamber as an etching gas, and a volumetric concentration of the inert gas in the etching gas is set to 60% or more in terms of flow rate ratio.

6. A semiconductor device manufacturing method, according to claim 1, wherein a film whose etching rate is lower than the resist pattern is formed as the mask material film.

7. A semiconductor device manufacturing method, according to claim 1, wherein the mask material film is formed to have a thickness of 50 nm or less.

8. A semiconductor device manufacturing method, according to claim 1, wherein a titanium nitride film or a titanium nitride aluminum film is used as the mask material film.

9. A semiconductor device manufacturing method, according to claim 1, wherein the removing of the auxiliary mask is performed by a wet etching using a mixed solution consisting of hydrogen peroxide and ammonium hydroxide as an etchant.

10. A semiconductor device manufacturing method, according to claim 1, further comprising:
    removing residues on the upper electrode by exposing the upper electrode to an oxygen plasma after the auxiliary mask is removed.

11. A semiconductor device manufacturing method, according to claim 1, further comprising:
    annealing the capacitor dielectric film in an oxygen atmosphere after the capacitor is constructed.

12. A semiconductor device manufacturing method, according to claim 1, further comprising:
    forming an interlayer insulating film to cover the capacitor after the capacitor is constructed.

13. A semiconductor device manufacturing method, according to claim 12, wherein, when shaping the first conductive film into the lower electrode by the patterning, a contact region of the lower electrode is formed to extend from the capacitor dielectric film, and
    further comprising, after forming the interlayer insulating film:
    forming a hole in the interlayer insulating film on the contact region of the lower electrode; and
    forming a conductive plug, which is connected electrically to the lower electrode, in the hole.

14. A semiconductor device manufacturing method, according to claim 1, wherein a noble metal film or a noble metal oxide film is formed as the second conductive film.

* * * * *